United States Patent [19]
Hamzehdoost et al.

[11] Patent Number: 5,910,686
[45] Date of Patent: Jun. 8, 1999

[54] CAVITY DOWN HBGA PACKAGE STRUCTURE

[75] Inventors: Ahmad Hamzehdoost, Sacramento; Robert J. Martin, Salida, both of Calif.

[73] Assignee: VLSI Technology, Inc., San Jose, Calif.

[21] Appl. No.: 09/121,792

[22] Filed: Jul. 23, 1998

[51] Int. Cl.[6] .......................... H01L 23/48; H01L 23/52; H01L 29/40
[52] U.S. Cl. .......................... 257/778; 257/706; 257/707
[58] Field of Search .................................. 257/778, 780, 257/761, 782, 783, 787, 706, 707, 668

[56] References Cited

U.S. PATENT DOCUMENTS

| | | |
|---|---|---|
| 5,530,282 | 6/1996 | Tsuji . |
| 5,661,086 | 8/1997 | Nakashima et al. . |
| 5,668,405 | 9/1997 | Yamashita . |
| 5,731,631 | 3/1998 | Yama et al. . |
| 5,834,839 | 11/1998 | Mertol . |
| 5,847,935 | 12/1998 | Thaler et al. . |

*Primary Examiner*—Carl Whitehead, Jr.
*Assistant Examiner*—S. V. Clark
*Attorney, Agent, or Firm*—Patrick T. King

[57] ABSTRACT

An integrated-circuit die is attached to the top interior surface of a die-cavity formed in the underside of a heat spreader. The other side of the integrated circuit die has a number of wire-bonding pads formed thereupon. A plurality of bonding-wire loops at least some of which are completely contained within the die-cavity to allow the part of the encapsulation or lid to be as thin as possible, while still covering the bonding wires. A first portion of a insulated tape layer covers the lower outside surface of the die-carrier/heat spreader and another portion of the insulated tape layer extends inside of the die-cavity and has a number of wire-bonding sites formed thereupon. A plurality of bonding-wire loops are bonded to one of the wire-bonding pads formed on the integrated-circuit die and the wire-bonding sites formed on the insulated tape layer. Conductive traces connect the wire-bonding sites located inside of the die-cavity to respective selective solderable areas arranged in a grid pattern for receipt of solder balls. Encapsulation material or a ceramic or metal lid cover and seal the integrated-circuit die and the bonding wires in the die-cavity. The wire-bonding sites formed in the die-cavity are adhesively fixed to the top interior surface of the die-cavity. To increase bonding-wire density, the wire-bonding sites and the wire-bonding pads on the integrated-circuit die are arranged in two or more rows. Other wire-bonding sites are optionally formed outside of the die-cavity.

12 Claims, 5 Drawing Sheets

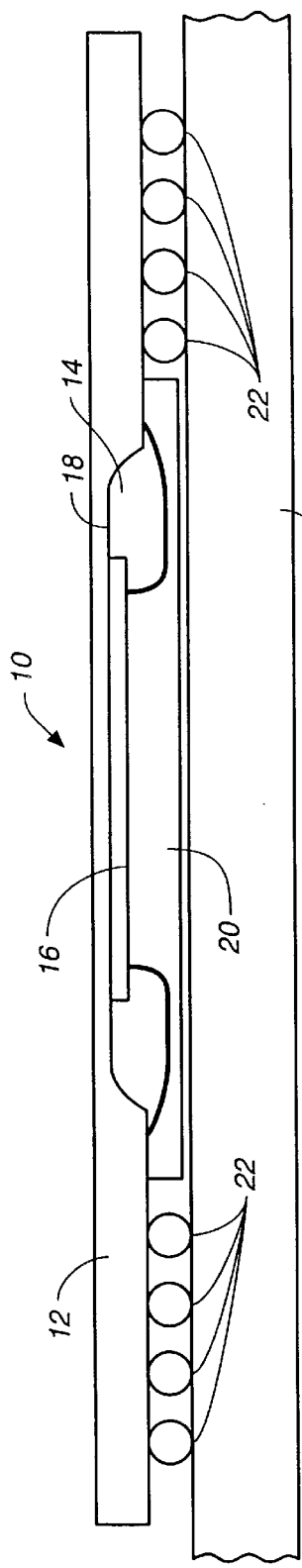
FIG._1 (PRIOR ART)
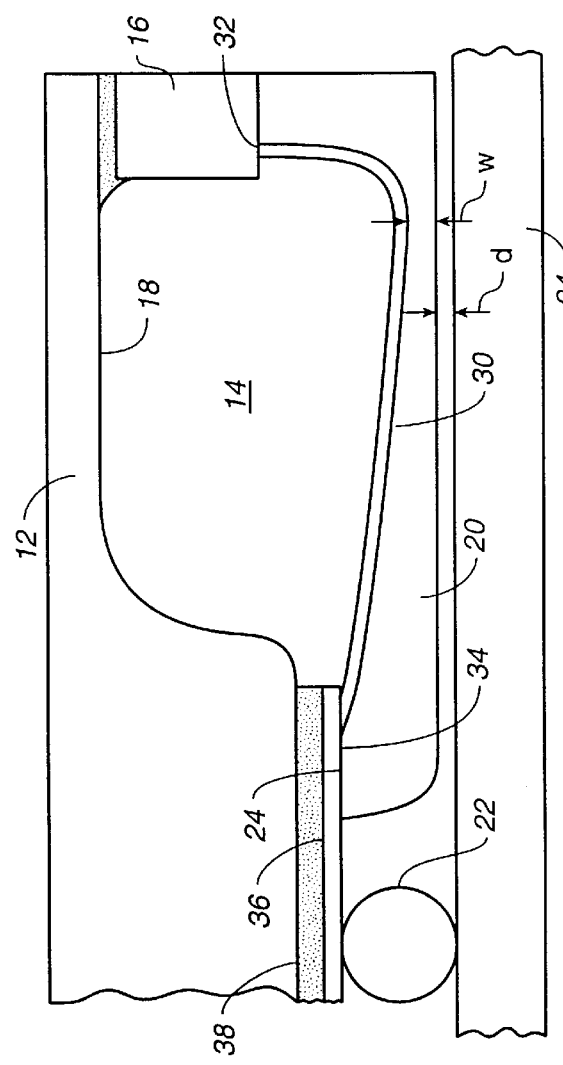
FIG._2 (PRIOR ART)

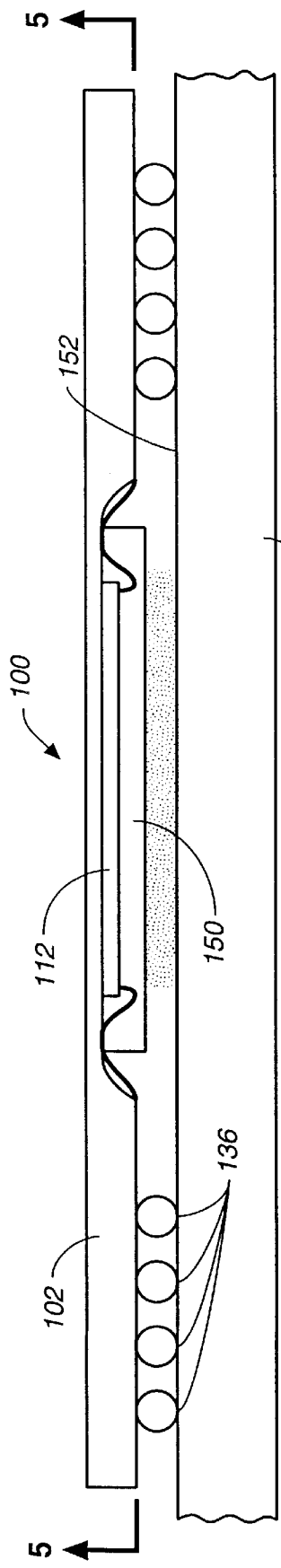
FIG._3
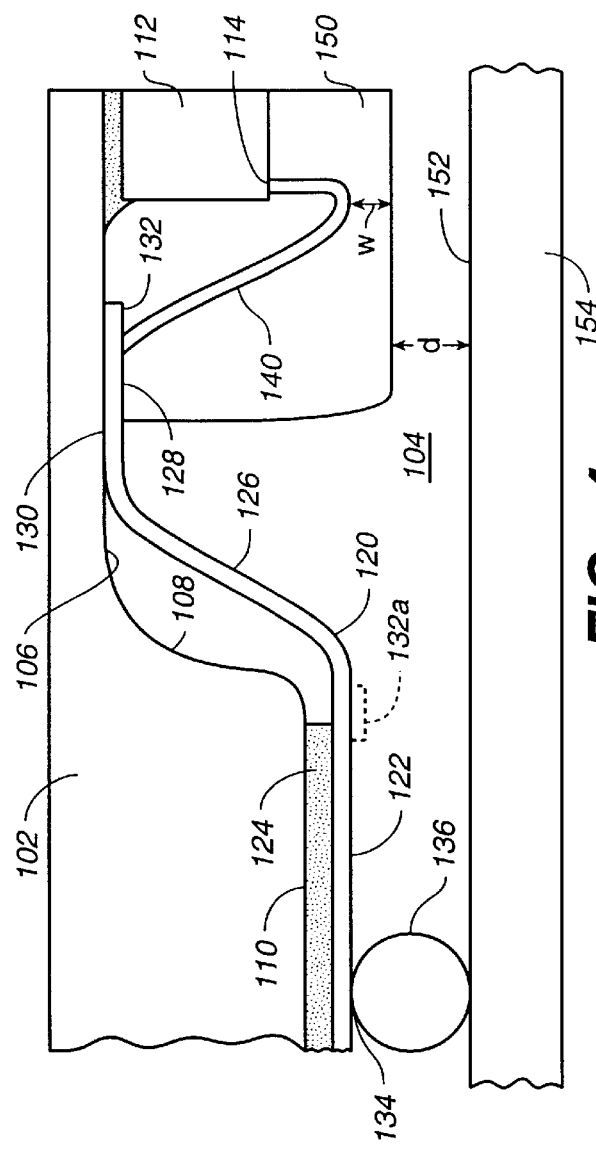
FIG._4

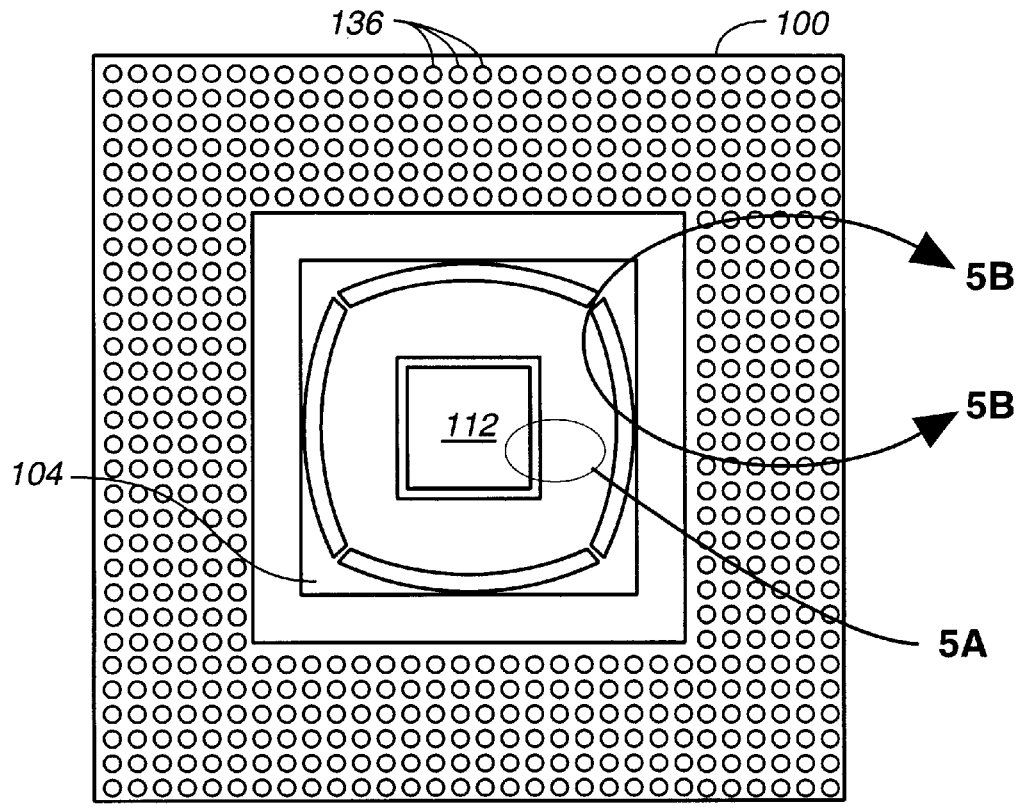
FIG._5
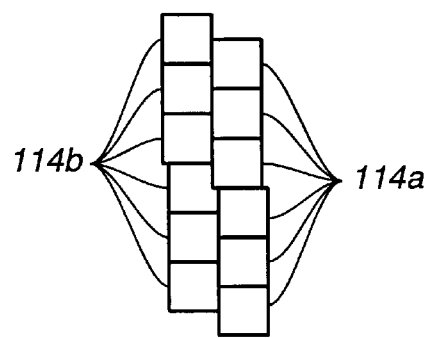
FIG._5A

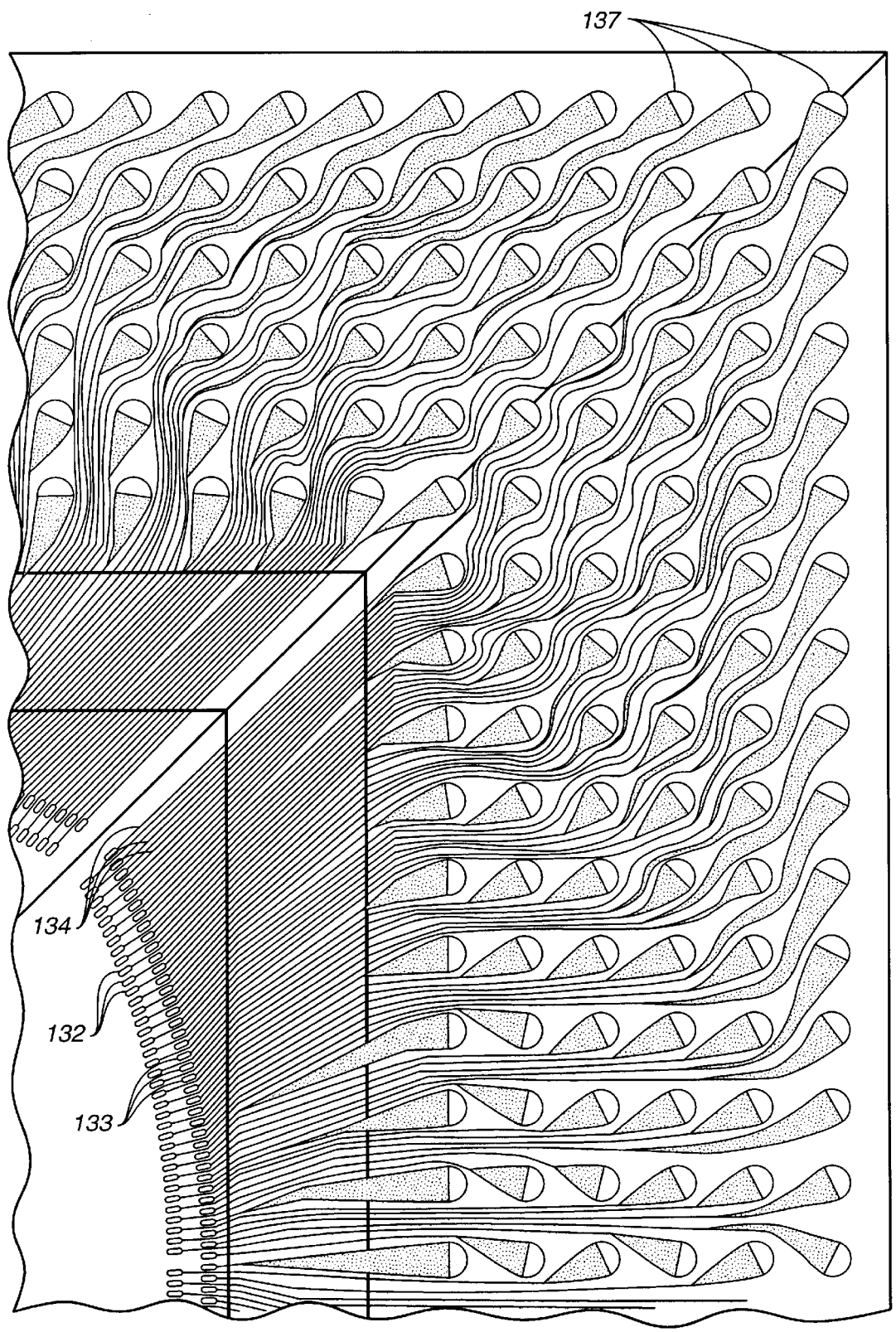
FIG._5B

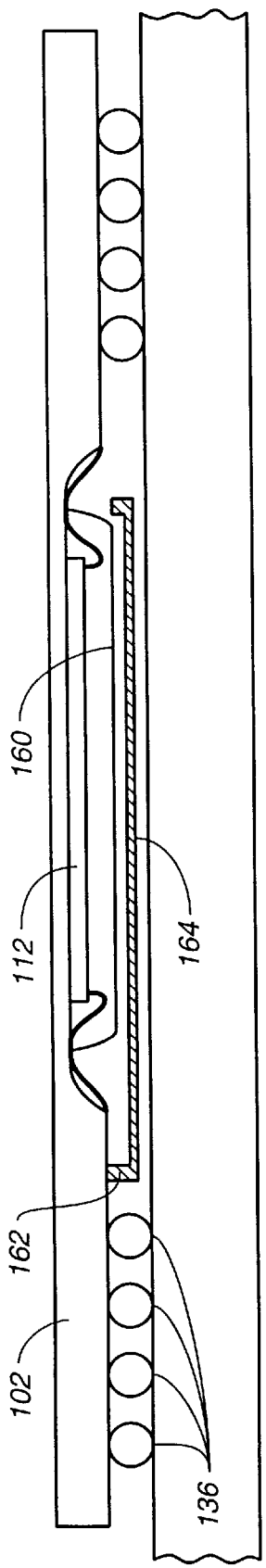
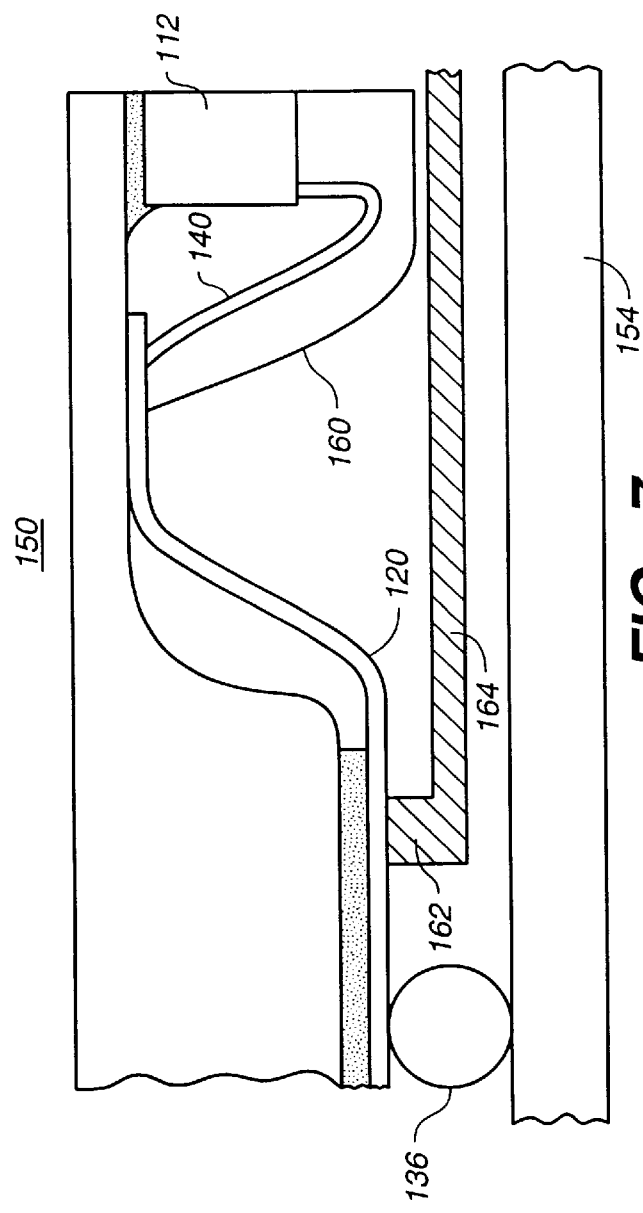

CAVITY DOWN HBGA PACKAGE STRUCTURE

BACKGROUND OF THE INVENTION

1. Field of the Invention

This invention relates to improvements in high performance cavity-down, ball grid array HBGA packages for integrated circuits.

2. Prior Art

A cavity-down HBGA package mounts an integrated-circuit die inside a cavity formed through the bottom side of a die-carrier/heat sink. Bonding wires are connected between wire-bonding pads on the integrated-circuit die and wire-bonding sites on an insulated polyimide tape layer, where the wire-bonding sites on the tape layer are located outside of the cavity and adjacent to the cavity on the bottom side of the die-carrier/heat sink.

The integrated-circuit die, the bonding wires, and the conductive bonding sites on the insulated tape layer are all encapsulated in an encapsulation cover. The encapsulation cover extends below the plane of the insulated tape layer. If the encapsulation cover is too thick, it may interfere with mounting of the HBGA package to a component-mounting surface of a printed-circuit board.

A number of conductive traces are formed on the insulated tape layer to connect the conductive bonding sites to selective solderable areas for solder balls. The selective solderable areas are located on the insulated tape outside of the cavity and away from the encapsulation cover. The selective solderable areas for the solder balls are formed on the insulated tape layer and are arranged in a grid pattern on the bottom side of the die-down HBGA package. A solder mask is formed over the insulated tape layer but not over the selective solderable areas on the insulated tape on the bottom side of the die-carrier/heat sink.

In order to mount an HBGA package to the surface of a printed-circuit board, the grid pattern of the solder balls is placed over a corresponding grid pattern of solderable areas on the printed-circuit board. The solder balls are then heated to a temperature sufficient to melt the solder balls and to solder the HBGA package to the surface of the printed-circuit board.

The bonding wires form wire loops. The wire loops extend between the bonding-wire pads on the integrated-circuit die, which are located in the cavity, to the bonding sites on the tape layer, which are located outside of the cavity. The bonding-wire loops also extend downwardly below the plane of the insulated tape layer on the bottom side of the die-carrier/heat sink. On the one hand, the encapsulation cap must be sufficiently thick so that it completely encapsulates the downwardly extending bonding-wire loops. One the other hand, the encapsulation cap must also be sufficiently thin so that sufficient clearance is provided between its bottom surface and the component-mounting surface of a printed-circuit board, when the HBGA package is soldered to the printed-circuit board with solder balls.

FIG. 1 illustrates a conventional HBGA package 10, which includes a die-carrier/heat spreader 12 which is formed of a metallic or ceramic material. The die-carrier/heat spreader has a die-cavity 14 formed through its lower surface. An integrated-circuit die 16 is attached to the top interior surface 18 of the die-carrier/heat spreader 12. A plurality of bonding wires are connected between the integrated-circuit die 16 and conductive traces formed on an insulated layer which surrounds the die-cavity 16. An encapsulation cap 20 covers the integrated-circuit die 16 and the bonding wires. A number of solder balls, typically shown as 22, are arranged in a grid and attached to the conductive traces formed on the insulated layer. The solder balls are also connected to a number of corresponding solder-ball attachment sites located on the top surface of a printed-circuit board 24. Note that thickness of the encapsulation cap 20 must be sufficiently thin and the solder balls sufficiently large, so that the bottom surface of the encapsulation cap provides sufficient clearance to the top surface of the printed-circuit board 24.

With reference to FIG. 1 and also to FIG. 2 in greater detail, the bonding wires, typically shown as 30, have one of their ends attached to bonding pads, typically shown as 32, on the lower surface of the integrated-circuit die 16. The other ends of the bonding wires are attached to wire-bonding sites, typically shown as 34, which are formed on an insulated tape layer 24. The insulated tape layer 24 is attached with an adhesive layer 36 to a lower surface 38 of the die-carrier/heat spreader 12. The lower surface 38 of the insulated tape layer 24 surrounds the cavity 14.

The encapsulation material, which forms the encapsulation cap 20, fills the cavity 14 and covers the integrated-circuit die 16, the bonding wires 30, and the wire-bonding sites 34, as illustrated. As illustrated in FIG. 2, the bonding wires 30 droop below the plane of the lower surface of the insulated tape layer 24. The encapsulation cap 28 must be thick enough to cover the drooping wire loops of the bonding wires 30 while still providing sufficient clearance to the top surface of the printed-circuit board 24.

A high performance ball grid array HBGA package has a grid with a center-to-center spacing, or pitch, between adjacent solder balls of 50 mils for solder balls with a final, assembled height of 19 mils. A solder ball with an initial height of 24–25 mils collapses to 19 mils when it is mounted to a package. When the package is finally assembled to a printed-circuit board, the solder ball will have a final height of 19 mils. The depth of the cavity 14 in the die-carrier/heat spreader 12 is 18 mils and the combined thickness of the adhesive layer 36 and the insulated tape layer 24 is 6 mils. The droop of the bonding wires loops below the plane of the lower surface of the insulated tape layer 24 is 10 mils. The distance w between the lowest point of a bonding wire and the lower surface of the encapsulation cap is 4 mils. For a solder ball having a thickness of 19 mils, the spacing d between the lower surface of the encapsulation cap 20 and the top surface of the printed-circuit board 24 is only 5 mils to provide clearance between the HBGA package and the surface of the printed-circuit board.

HBGA packages having solder-ball grid spacings smaller than 50 mils require using solder ball with final thicknesses less than 19 mils. Consequently the package configuration illustrated in FIGS. 1 and 2 is limited to larger solder balls and larger grid spacings.

Consequently, it can be appreciated that the design of an HBGA package requires attention to the dimensions and allowable tolerances for certain critical parameters, such as the droop of the wire loops and the thickness of the encapsulation cap. This is especially important for higher density cavity-down BGA packages with a solder-ball spacing, or pitch, which is less than 50 mils or 1.27 mm. pitches. As the diameter of the solder balls get smaller, the clearance between the package and the surface of the motherboard also get smaller.

Consequently, a need exists for an improved cavity-down HBGA package which minimizes the thickness of the encapsulation layer while still accommodating a greater number of bonding wires and which provides for a closer grid spacing for smaller solder balls.

SUMMARY OF THE INVENTION

It is therefore an object of the invention to provide a cavity-down high performance ball grid array HBGA package which is to be used with leads having a spacing equal to or less than 1.27 mm. In this kind of cavity-down package, it is important to allow greater clearance of the package from a package seating plane on, for example, a printed-circuit mother board.

It is a further object of the invention to provide a cavity-down HBGA package with finer spacing or pitch between wire-bonding sites and wire-bond leads.

It is another object of the invention to provide a cavity-down HBGA package design with the capability of using smaller solder balls and a finer grid array.

In accordance with these and other objects of the invention an improved cavity-down HBGA integrated-circuit package is provided which extends wire-bonding sites into the die-cavity using insulated tapes. The improved cavity-down HBGA integrated-circuit package includes a heat conductive die-carrier/heat spreader with a die-cavity formed through its lower surface. One side of an integrated-circuit die is attached to the top interior surface of the die-cavity. The other side of the integrated circuit die has a number of wire-bonding pads formed thereupon.

An important aspect of the invention is that the bonding-wire loops are contained within the die-cavity above the plane of the first portion of the insulated tape layer which extends over the lower outside surface of the die-carrier/heat spreader outside of the die-cavity. This allows the part of the encapsulation or lid which extends below the plane of the first portion of the insulated tape layer to be as thin as possible, while still covering the bonding wires.

A first portion of a insulated tape layer is formed, for example, of polyimide which covers the lower outside surface of the die-carrier/heat spreader. The first portion lies outside of the die-cavity and extends away from the die cavity. Another portion of the insulated tape layer extends inside the die-cavity and has a number of wire-bonding sites formed thereupon.

A plurality of bonding-wire loops are looped between and bonded to one of the wire-bonding pads formed on the integrated-circuit die and a respective one of the wire-bonding sites formed on the insulated tape layer.

A number of conductive traces are formed on the insulated tape layer to connect the wire-bonding sites located inside of the die-cavity to respective selective solderable areas formed outside of the die-cavity on the insulated layer. A plurality of solder balls are attached to respective selective solderable areas formed on the insulated layer outside of the die-cavity. A solder mask is formed over the insulated tape layer to cover the conductive traces but does not cover the selective solderable areas outside of the die-cavity and the wire-bonding sites inside the die-cavity. The selective solderable areas on the insulated layer are arranged in a grid pattern on the bottom side of the die-down HBGA package.

The package is sealed with sealing means, such as, for example, encapsulation material or a ceramic or metal lid in order to cover and seal the integrated-circuit die, the bonding wires. The lower surface of the lid or encapsulation is adapted to be spaced apart from mounting surface for the HBGA package.

The other portion of the insulated tape layer, which is located inside the die-cavity of the die-carrier/heat and which has wire-bonding sites formed thereupon, is adhesively fixed to the top interior surface of the die-cavity. The portion of the insulated tape layer which extends over the lower outside surface of the die-carrier/heat spreader outside of the die-cavity is adhesively fixed to the lower outside surface of the die-carrier/heat spreader.

To get a greater density of bonding wires within this type of package configuration, the wire-bonding sites formed on the insulated tape layer inside the die-cavity are arranged in at least two rows so that adjacent wire-bonding sites are in different rows. Similarly, the wire-bonding pads formed on the integrated-circuit die are arranged to provide at least two adjacent rows near the edge of the integrated-circuit die. In both of these arrangements, a greater number of bonding wires can be accommodated because alternate bonding sites and bonding pads are located side-to-side while adjacent bonding pads and bonding sites are located front-to-back.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a side sectional view of a conventional HBGA package.

FIG. 2 is an enlarged side sectional view of a portion of the conventional HBGA package of FIG. 1.

FIG. 3 is a side sectional view of improved encapsulated cavity-down HBGA package according to the invention.

FIG. 4 is an enlarged side sectional view of a portion of the improved cavity-down encapsulated HBGA package of FIG. 3.

FIG. 5 is diagrammatic bottom view of an improved cavity-down HBGA package without encapsulation or a lid, showing an array of solder ball attachment sites, a die-attach cavity in a die-carrier/heat spreader, bonding wire attachment sites in the die-attach cavity, and an integrated-circuit die with wire-bond pads.

FIG. 5A is an enlarged partial view of the 5A portion of FIG. 5, showing some of the staggered bonding pads on the integrated-circuit die.

FIG. 5B is an enlarged sectional plan view, taken along section line 5B—5B of FIG. 5, showing a portion of an insulated tape layer with wire bonding sites which are located in the die-attach cavity, conductive traces, and selective solderable areas outside of the die-attach cavity for attachment of solder balls.

FIG. 6 is a side sectional view of an improved lidded cavity-down HBGA package according to the invention.

FIG. 7 is an enlarged side sectional view of a portion of the improved lidded cavity-down HBGA package of FIG. 6.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover any alternatives, modifications and equivalents, which may be included within the spirit and scope of the invention as defined by the appended claims.

FIG. 3 and FIG. 4, in more detail, illustrate an improved die-down HBGA integrated-circuit package 100. A die-carrier/heat spreader 102 is formed of a heat conductive material, such as a metallic material or a ceramic material. The die-carrier/heat spreader 102 includes has a die-cavity 104 which is formed through its lower surface and which is defined by a horizontally-extending top interior surface 106 and substantially vertically-extending interior side walls 108. The die-carrier/heat spreader 102 further includes a lower surface 110 outside of and surrounding the die-cavity 104.

An integrated-circuit die 112 is provided with a pair of opposing surfaces, where the top surface is a die-mounting surface and the bottom surface has wire-bonding pads, typically shown as 114, formed thereupon. A die-down package configuration is provided by having the die-mounting surface of the integrated-circuit die 112 be attached to the top interior surface 106 of the die-cavity, as illustrated.

A 4 mil thick insulated tape layer 120 is formed, for example, of polyimide. A first portion 122 of the insulated tape layer 120 extends over the lower outside surface 110 of the die-carrier/heat spreader 102. The first portion 122 of the insulated tape layer 120 is adhesively bonded to the lower outside surface 110 of the die-carrier/heat spreader 102 with a layer 124 of adhesive material. The insulated tape layer 120 has an other portion 126 which extends inside the die-cavity 104 and which has an end section 128 adhesively bonded inside the die-cavity 104, preferably to the top interior surface 106 of the die-cavity 104 with a layer 130 of adhesive material. Note that the interior portion 126 of the insulated tape layer 120 is not bonded to the interior side walls 108 of the cavity 104. Only the end section 128 is bonded to the top surface of the cavity 104.

FIG. 5 diagrammatically shows the improved cavity-down HBGA package 100 without encapsulation or a lid.

FIG. 5A shows a typical arrangement of two rows of staggered wire-bonding pads, typically shown as 114a, 114b, which are formed near the edge of the integrated-circuit die 112 to permit an increased number of bonding wires. Two or more rows of wire-bonding pads are used, as required.

FIG. 5B is an enlarged sectional plan view, taken along section line 5B—5B of FIG. 5, showing a portion of an insulated tape layer with wire bonding sites which are located in the die-attach cavity, conductive traces, and selective solderable areas outside of the die-attach cavity for attachment of solder balls. The interior end sections 128 of the insulated tape layer 120 have a number of wire-bonding sites 132, 133 formed thereupon. FIG. 5B shows that the wire-bonding sites 132, 133 formed on the insulated tape layer 120 and located inside the die-cavity can be arranged in at least two rows such that adjacent wire-bonding sites 132, 133 are in different rows. This arrangement permits an increased number of wire bonding sites to be used within a restricted area in the die-cavity 104. Two or more rows can be used, as required.

While it is desirable to have wire bonding sites within the die-cavity, an optimal arrangement provides some alternative wire-bonding sites on the insulated tape outside of the die-cavity and some wire-bonding sites inside the die-cavity. Alternative bonding wire-loops are then looped between wire-bonding pads and the alternative wire-bonding sites. Encapsulation or a cover are provided to accommodate having bonding sites both inside and outside of the die-cavity, as required. The bonding sites outside of the die-cavity are configured similar to the wire-bonding sites of FIG. 2 to provide wire-bonding sites both inside and outside of the die-cavity.

A number of conductive traces, typically shown as 134 in FIG. 5B are formed on the insulated tape layer 120. These conductive traces connect the wire-bonding sites 132 located inside of the die-cavity to respective selective solderable areas, typically shown as 137, formed in a grid pattern on the insulated layer outside of the die-cavity for attachment of solder balls. As illustrated in FIG. 5, for this HBGA package, the selective solderable areas 137 on the insulated layer and outside of the die-cavity are arranged in a grid pattern.

FIG. 4 shows plurality of bonding-wire loops, typically shown as 140, are looped between and bonded to one of the wire-bonding pads 114 formed on the integrated-circuit die 112 and a respective one of the wire-bonding sites 132 formed on the insulated tape layer within the die-cavity. The bonding-wire loops 140 are contained within the die-cavity above the plane of the first portion of the insulated tape layer which extends over the lower outside surface of the die-carrier/heat spreader outside of the die-cavity.

A solder mask (not shown) is formed over the insulated tape layer 120 to cover the conductive traces but not to cover the selective solderable areas 134 outside of the die-cavity 104 and the wire-bonding sites 132, 133 inside the die-cavity.

A plurality of solder balls attached to respective selective solderable areas 134 formed on the insulated layer outside of the die-cavity for the HBGA package.

As illustrated in FIG. 4, sealing means are provided for covering and sealing the integrated-circuit die 112 and the bonding wires 140. The sealing means includes an encapsulation layer 150 covering the integrated-circuit die 112 and the bonding wires 140 in the die-cavity 104. The lower outside surface of the encapsulation layer 150 is adapted to be spaced apart from a surface 152 on a printed-circuit board 154, or the like, to which an HBGA package is mounted.

A high performance ball grid array HBGA package illustrated in FIGS. 3, 4, and 5 has a cavity depth of 18 mils. The combined thickness of the adhesive layer 124 and the insulated tape layer 120 is 6 mils. The droop of the bonding wires loops below the integrated circuit die is 10 mils. The distance w between the lowest point of a bonding wire and the lower surface of the encapsulation cap is 4 mils. For a solder ball having a thickness of 19 mils, the spacing d between the lower surface of the encapsulation cap 150 and the top surface of the printed-circuit board 154 is 16 mils to provide clearance between the HBGA package and the surface of the printed-circuit board.

Because of the availability of the improved spacing d, the improved die-down HBGA package according to the invention can accommodate smaller solder balls and smaller grid spacings. As the diameter of the solder balls get smaller, the clearance between the package and the surface of the motherboard also get smaller. A finished solder ball height of 8 mils can be accommodated with a die-down HBGA package according to the invention. With the invention, cavity-down HBGA packages with pitches of 1 mm. and 0.8 mm. can be constructed without assembly problems caused by this clearance issue.

FIGS. 6 and 7 illustrate another embodiment of an improved lidded HBGA package 150 according to the invention. This embodiment is similar to that disclosed in connection with FIGS. 3, 4, and 5 and the same reference numerals are used for common elements. In this embodiment the sealing means includes an initial glob top covering 160 for the bonding wires 140 and the integrated-circuit die 112. Upwardly extending peripheral edge portions 162 of a metal or ceramic lid, or cover, 164 are then adhesively attached to the insulated tape 120 adjacent to the array of solder balls 136. The lid 164 covers the entire die-cavity 104.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed:

1. A cavity-down HBGA integrated-circuit package for an integrated-circuit die, comprising:

an integrated-circuit die having a pair of opposing surfaces, one of which is a die-mounting surface and the other surface of which has wire-bonding pads formed thereupon;

a die-carrier/heat spreader which has a die-cavity formed through its lower surface, wherein the die-cavity is defined by a top interior surface and interior side walls, wherein the die-mounting surface of the integrated-circuit die is attached to the top interior surface of the die-cavity, and wherein the die-carrier/heat spreader further includes a lower surface outside of and surrounding the cavity;

a first portion of an insulated tape layer which extends over the lower outside surface of the die-carrier/heat spreader outside of the die-cavity;

the insulated tape layer also having second portions which are located inside the die-cavity of the die-carrier/heat sink and which second portions have wire-bonding sites formed thereupon;

a plurality of bonding-wire loops, each of which is looped between and bonded to one of the wire-bonding pads formed on the integrated-circuit die and a respective one of the wire-bonding sites formed on the insulated tape layer within the die-cavity to form bonding-wire loops;

wherein a number of conductive traces are formed on the insulated tape layer to connect the wire-bonding sites located inside of the die-cavity to respective selective solderable areas formed on the insulated layer outside of the die-cavity;

wherein the selective solderable areas on the insulated layer and outside of the die-cavity are arranged in a grid pattern on the bottom side of a die-down HBGA package;

a plurality of solder balls attached to respective selective solderable areas formed on the insulated layer outside of the die-cavity; and sealing means for covering and sealing the integrated-circuit die, the bonding wires, said sealing means having a lower outside surface formed therein and adapted to be spaced apart from a surface to which an HBGA package is mounted.

2. The package of claim 1 wherein the bonding-wire loops are contained within the die-cavity above the plane of the first portion of the insulated tape layer which extends over the lower outside surface of the die-carrier/heat spreader outside of the die-cavity.

3. The package of claim 1 wherein the second portions of the insulated tape layer, which are located inside the die-cavity of the die-carrier/heat and which have wire-bonding sites formed thereupon, are adhesively fixed to the top interior surface of the die-cavity in the die-carrier/heat spreader.

4. The package of claim 1 wherein the portion of the insulated tape layer which extends over the lower outside surface of the die-carrier/heat spreader outside of the die-cavity is adhesively fixed to the lower outside surface of the die-carrier/heat spreader.

5. The package of claim 1 wherein the wire-bonding sites formed on the insulated tape layer and located inside the die-cavity of the die-carrier/heat sink are arranged in at least two rows such that adjacent wire-bonding sites are in different rows.

6. The package of claim 7 wherein the wire-bonding pads formed on the integrated-circuit die are arranged in at least two adjacent rows near the edge of the integrated-circuit die.

7. The package of claim 1 wherein the insulated tape layer has at least some third portions which are located outside of the die-cavity and which have wire-bonding sites formed thereupon for attachment of additional bonding-wire loops.

8. The package of claim 1 wherein the sealing means includes an encapsulation layer covering the integrated-circuit die and the bonding wires in the die-cavity.

9. The package of claim 1 wherein the sealing means includes a cover which is positioned over the integrated-circuit and the bonding wires.

10. The package of claim 1 wherein the die-carrier/heat spreader is formed of a heat conductive material.

11. The package of claim 9 wherein the die-carrier/heat spreader is formed of a metallic material.

12. The package of claim 9 wherein the die-carrier/heat spreader is formed of a ceramic material.

* * * * *